United States Patent
Wei et al.

(10) Patent No.: US 8,409,997 B2
(45) Date of Patent: Apr. 2, 2013

(54) APPARATUS AND METHOD FOR CONTROLLING SILICON NITRIDE ETCHING TANK

(75) Inventors: Zin-Chang Wei, Hsin-Chu (TW); Tsung-Min Huang, Lujhou (TW); Ming-Tsao Chiang Chiang, Jhubei (TW); Cheng-Chen Calvin Hsueh, Linkou (TW)

(73) Assignee: Taiwan Semiconductor Maufacturing Co., Ltd., Hsin-Chu (TW)

( * ) Notice: Subject to any disclaimer, the term of this patent is extended or adjusted under 35 U.S.C. 154(b) by 586 days.

(21) Appl. No.: 11/627,030

(22) Filed: Jan. 25, 2007

(65) Prior Publication Data

US 2008/0179293 A1 Jul. 31, 2008

(51) Int. Cl.
*H01L 21/302* (2006.01)

(52) U.S. Cl. .......... 438/745; 438/756; 438/757; 216/83; 216/84

(58) Field of Classification Search .................. 438/745, 438/756, 757; 216/83, 84
See application file for complete search history.

(56) References Cited

U.S. PATENT DOCUMENTS

| | | | |
|---|---|---|---|
| 5,248,249 A | 9/1993 | Yamamoto et al. | |
| 5,911,837 A | 6/1999 | Matthews | |
| 6,001,215 A * | 12/1999 | Ban .......................... | 156/345.15 |
| 6,207,068 B1 | 3/2001 | Glick et al. | |
| 6,399,517 B2 * | 6/2002 | Yokomizo et al. ............ | 438/745 |
| 6,699,400 B1 | 3/2004 | Ballantine et al. | |
| 6,979,655 B2 | 12/2005 | Niuya et al. | |
| 2002/0173154 A1 | 11/2002 | Tucker et al. | |
| 2003/0203632 A1 * | 10/2003 | Heo et al. ....................... | 438/690 |
| 2004/0140365 A1 * | 7/2004 | Izuta ............................... | 237/12 |
| 2004/0144750 A1 * | 7/2004 | Ballantine et al. .............. | 216/20 |
| 2004/0187342 A1 | 9/2004 | Izuta | |
| 2004/0200806 A1 * | 10/2004 | Izuta et al. ....................... | 216/99 |
| 2005/0019498 A1 * | 1/2005 | Osawa ........................... | 427/331 |
| 2005/0067101 A1 * | 3/2005 | Funabashi ................. | 156/345.18 |
| 2005/0230045 A1 | 10/2005 | Okuchi et al. | |
| 2005/0263488 A1 * | 12/2005 | Change et al. .................. | 216/83 |
| 2006/0057849 A1 | 3/2006 | Yim | |
| 2006/0263251 A1 * | 11/2006 | Watatsu et al. .............. | 422/68.1 |

FOREIGN PATENT DOCUMENTS

| | | |
|---|---|---|
| WO | WO 2005/067019 A1 | 7/2005 |
| WO | WO 2005067019 A1 * | 7/2005 |

\* cited by examiner

*Primary Examiner* — Binh X Tran
(74) *Attorney, Agent, or Firm* — Duane Morris LLP

(57) ABSTRACT

A method and system for controlling a silicon nitride etching bath provides the etching bath including phosphoric acid heated to an elevated temperature. The concentration of silicon in the phosphoric acid is controlled to maintain a desired level associated with a desired silicon nitride/silicon oxide etch selectivity. Silicon concentration is measured while the silicon remains in soluble form and prior to silica precipitation. Responsive to the measuring, fresh heated phosphoric acid is added to the etching bath when necessary to maintain the desired concentration and silicon nitride:silicon oxide etch selectivity and prevent silica precipitation. The addition of fresh heated phosphoric acid enables the etching bath to remain at a steady state temperature. Atomic absorption spectroscopy may be used to monitor the silicon concentration which may be obtained by diluting a sample of phosphoric acid with cold deionized water and measuring before silica precipitation occurs.

16 Claims, 3 Drawing Sheets

APPARATUS AND METHOD FOR CONTROLLING SILICON NITRIDE ETCHING TANK

FIELD OF THE INVENTION

The present invention relates, most generally, to semiconductor device manufacturing. More particularly, the present invention relates to a method and system for maintaining a hot phosphoric acid bath used for etching silicon nitride and other semiconductor materials.

BACKGROUND

Silicon nitride is a dielectric material that is very frequently used in many applications in the manufacture of semiconductor devices. A film of silicon nitride is typically formed over a semiconductor substrate upon which semiconductor devices are being fabricated. The film is then patterned using an etching process that includes phosphoric acid. The wet chemical etching of silicon nitride has traditionally been done using hot phosphoric acid ($H_3PO_4$) at temperatures of around 160° C. The basic chemical reactions that model the etching of silicon nitride with phosphoric acid are:

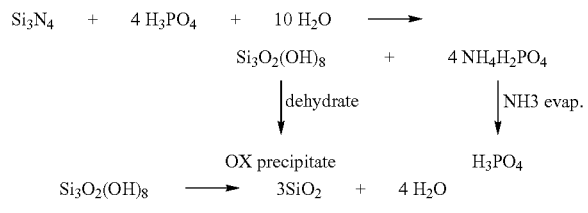

The silicon nitride etch process is heavily influenced by process parameters including $H_3PO_4$ and silicon concentration, as evidenced by silica, $SiO_2$ precipitation, temperature of the etch bath and the bath life of the hot phosphoric bath. The oxide (silicon dioxide, $SiO_2$) etch rate is also affected by process conditions, in particular the silicon concentration in the etching bath. The oxide etch rate becomes dramatically lower as the Si concentration in the bath increases. The Si concentration therefore directly affects the silicon nitride:silicon oxide etch selectivity. It is therefore desirable to maintain the bath conditions such as the $H_3PO_4$ and silicon concentration and the bath temperature, at constant levels so as to produce constant etch rates and etch selectivities, and process repeatability. As bath life increases, however, these parameters may undesirably vary. It can be seen that it is critical to maintain and control the silicon, Si, concentration in order to maintain constant silicon nitride and silicon oxide etch rates and silicon nitride/oxide etch selectivity. Literature indicates that the oxide precipitate, i.e., the dehydration of $Si_3O_2(OH)_8$ to form $SiO_2$ and water, occurs after reaching saturation solubility at about 120 ppm at 165° C. Different temperatures have other saturation solubility levels. The generation of oxide precipitates results in a particle source which is the major yield killer in semiconductor processing.

One known procedure for maintaining a wet silicon nitride etch process is to allow the silica to precipitate and to remove the precipitate by decreasing the temperature. One silica extraction system is designed to remove the generated silica using lower temperature $H_3PO_4$ with a high Si concentration. Shortcomings of this procedure include the difficulty in maintaining a high extraction efficiency for precipitated silica, which may melt into the $H_3PO_4$ solution again if not removed quickly and if allowed a long reaction time.

It would therefore be desirable to maintain the etching bath to provide relatively constant etching characteristics without suffering from the aforementioned shortcomings.

SUMMARY OF THE INVENTION

To address these and other needs and in view of its purposes, the invention provides a method for controlling an etching bath. The method includes providing an etching bath containing phosphoric acid heated to an elevated bath temperature, measuring silicon concentration of silicon in the phosphoric acid while the silicon remains in soluble form and controlling the silicon concentration by adding fresh heated phosphoric acid to the etching bath when necessary to maintain a desired silicon concentration, responsive to the measured silicon concentration. The silicon is monitored before it precipitates as silica. By maintaining a desired silicon concentration, the silicon nitride:silicon oxide etch selectivity is also maintained within a desired range According to another aspect, a method for controlling a silicon nitride etching bath is provided. The method includes providing an etching bath containing phosphoric acid heated to an elevated bath temperature greater than 120° C., measuring silicon concentration of silicon in the phosphoric acid while the silicon remains in soluble form, and, responsive to the measuring, controlling the silicon concentration to maintain a silicon nitride:silicon oxide etch selectivity of the etching bath within a desired range by adding fresh heated phosphoric acid to the etching bath when necessary while maintaining the elevated bath temperature so that it does not deviate by greater than two percent.

According to another aspect, an apparatus for controlling an etching bath includes an etching bath containing phosphoric acid maintained at an elevated bath temperature. The apparatus further includes a measuring system that measures silicon concentration of silicon in soluble form in the phosphoric acid. The apparatus also includes a heater member that heats the fresh phosphoric acid, means for adding the fresh heated phosphoric acid to the etching bath and a controller that controls silicon concentration by causing the heated fresh phosphoric acid to be added to the etching bath if necessary to maintain a silicon concentration and therefore the silicon nitride:silicon oxide etch selectivity, within desired ranges.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The invention provides an apparatus and method for controlling silicon nitride etch rates, silicon oxide etch rates and silicon nitride:silicon oxide etch selectivity in a phosphoric acid etching bath by measuring and controlling the silicon concentration in the etching bath. The apparatus and method measure silicon concentration before silica precipitates from the bath. When silicon nitride is etched in a hot phosphoric acid bath, silicon from the silicon nitride is liberated and complexes with oxygen and hydroxyl groups and when the concentration becomes too high as additional silicon nitride is etched, a silicon dioxide (silica, $SiO_2$) precipitate is formed according to the chemical reaction shown above. Responsive to the measured silicon concentration, the method and apparatus compare the measured silicon concentration to a desired silicon concentration and determine if phosphoric acid spiking is needed. Spiking is the addition of fresh, pure phosphoric acid to the bath. The addition of the fresh phosphoric acid restores the silicon concentration in the bath and therefore the etch rates and etch selectivities to desired levels. The invention provides for spiking with heated phosphoric acid in order to maintain a desired, steady-state temperature and therefore desired etching characteristics of the etching bath. The spiking method of the invention also presents silica precipitation which is a particle source that degrades device yield.

Figure 1:
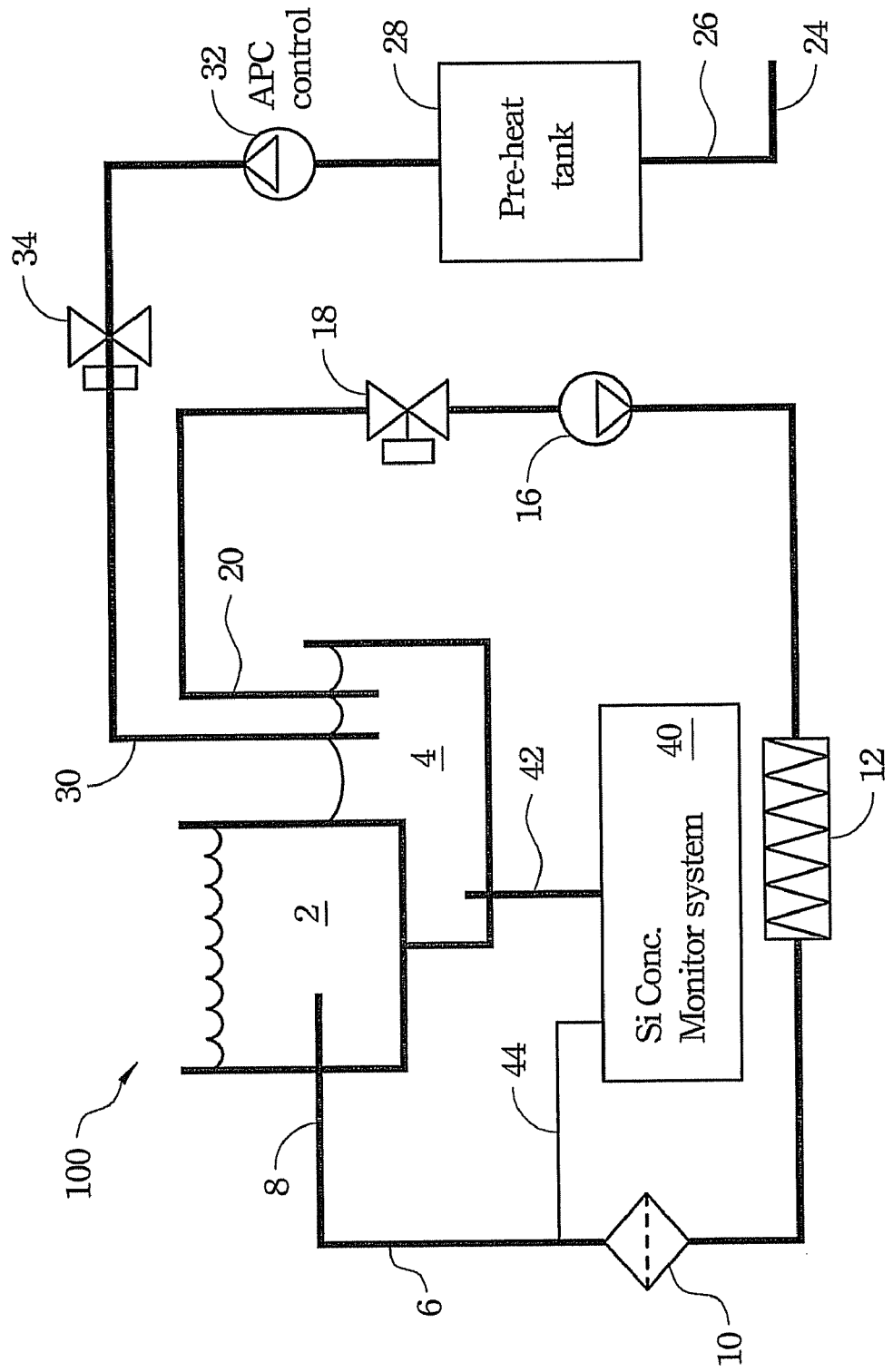
FIG. 1 is a schematic view illustrating the system of the invention.

FIG. 1 is a schematic of an exemplary system 100 of the invention. System 100 includes etching bath 2 which contains hot phosphoric acid. In one exemplary embodiment, the hot phosphoric acid, $H_3PO_4$, may be maintained at about 150° C. In other exemplary embodiments, the hot phosphoric acid may be maintained at a temperature within the range of about 70° C.-160° C. In still another exemplary embodiment, a temperature of 100° C. or greater may be maintained for the $H_3PO_4$ bath. Various conventional heating members may be used to heat the $H_3PO_4$ in etching bath 2. In addition to inner tank of etching bath 2, outer tank 4 may optionally be present. The apparatus may include recirculation loop 6 into which $H_3PO_4$ is introduced at outlet port 20. Recirculation loop 6 may include an optional filter 10, heater 12, pump 16 and valve 18, although other arrangements may be used in other exemplary embodiments. According to an exemplary embodiment, the temperature of the $H_3PO_4$ in etching bath 2 is maintained by heating the $H_3PO_4$ in recirculation loop 6 using heater 12, then dispensing the heated, hot $H_3PO_4$ at inlet port 8. In another exemplary Embodiment (not shown), outer tank 4 may not be needed and alternative means may be used to maintain the $H_3PO_4$ in etching bath 2, at desired temperature levels.

Fresh $H_3PO_4$ is provided at inlet 24 of feed loop 26. Preheat tank 28 heats the fresh $H_3PO_4$ such that the $H_3PO_4$ delivered at inlet 30 is at an elevated temperature, within a range of about 70° C. to about 175° C., for example. Other temperatures may be used in other exemplary embodiments. Feed loop 26 also includes pump controller 32 and flow meter 34. Controller 32, flow meter 34 and pre-heat tank 28 may be in communication with Si concentration monitoring system 40. Si concentration monitoring system 40 may draw $H_3PO_4$ from outer tank 4 by way of port 42 and in another exemplary embodiment, Si concentration monitoring system 40 may draw $H_3PO_4$ from recirculation loop 6 at port 44.

Si concentration monitoring system 40 dynamically monitors the silicon concentration in etch bath 2. The Si concentration is monitored by taking a sample of $H_3PO_4$ from either outer tank 4 or recirculation loop 6 in the illustrated embodiment but Si concentration monitoring system 40 may be in direct contact with the $H_3PO_4$ in etching bath 2 in other exemplary embodiments. Semiconductor or other substrates (not shown) with silicon nitride films thereon may be etched in the hot $H_3PO_4$ in etching bath 2. Various numbers of wafers may be etched at various frequencies after the $H_3PO_4$ is initially dispensed into etching bath 2. The silicon nitride is etched by $H_3PO_4$ according to:

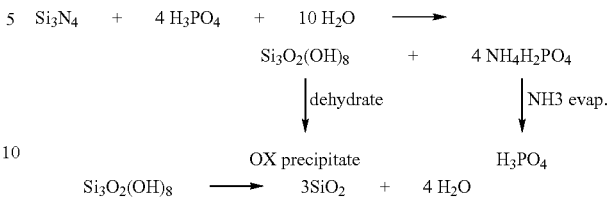

Conditions of etching bath 2 are maintained so as to prevent the oxide precipitate, i.e. $SiO_2$ or silica, from forming. In one exemplary embodiment, a concentration of no greater than about 60-110 ppm is allowed and in another exemplary a Si concentration no greater than about 60 ppm is maintained. The saturated silicon solubility level is not allowed to be reached thus preventing particles of silica precipitates from contaminating etching bath 2 and any product being etched in etching bath 2. In one exemplary embodiment in which the temperature of etch bath 2 is about 165° C., Si concentration is prevented from exceeding 120 ppm. In other exemplary embodiments, different ranges of allowable silicon concentration may be maintained. In one exemplary embodiment, the silicon concentration may be maintained within a range of about 110 to 120 ppm to reach the maximum silicon nitride/silicon oxide etch selectivity that may be required for a particular process.

Si concentration monitoring system 40 measures the Si concentration in the $H_3PO_4$. In one exemplary embodiment, atomic absorption spectroscopy is used, but other techniques may be used in other exemplary embodiments. In one particular embodiment, the hot $H_3PO_4$ delivered to Si concentration monitoring system 40 may be diluted with comparatively cold deionized water to form a diluted sample and the diluted sample measured for silicon concentration essentially immediately after the dilution, i.e., before silica precipitation occurs. The deionized water may be at room temperature, i.e. unheated, in one exemplary embodiment. Other techniques may be used in other exemplary embodiments.

Responsive to the measured silicon concentration, Si concentration monitoring system 40 communicates with controller 32 to spike the heated $H_3PO_4$ into outer tank 4 via port 30 when necessary to adjust silicon concentration to remain at a desired level, i.e., to suppress silicon concentration by adding fresh $H_3PO_4$ which contains no silicon. The silicon concentration is related to the silicon nitride etch, the silicon oxide etch rate and the silicon nitride:silicon oxide etch selectivity of the bath. Si concentration monitoring system 40 may sample and measure $H_3PO_4$ on a periodic, regular or essentially constant basis and therefore fresh $H_3PO_4$ may be added at port 30, responsive to the measuring at the same frequency. The volume of fresh heated $H_3PO_4$ added to the bath will be determined by the measured silicon concentration. Different volumes may be added, according to calculations performed as will be illustrated below.

Figure 2:
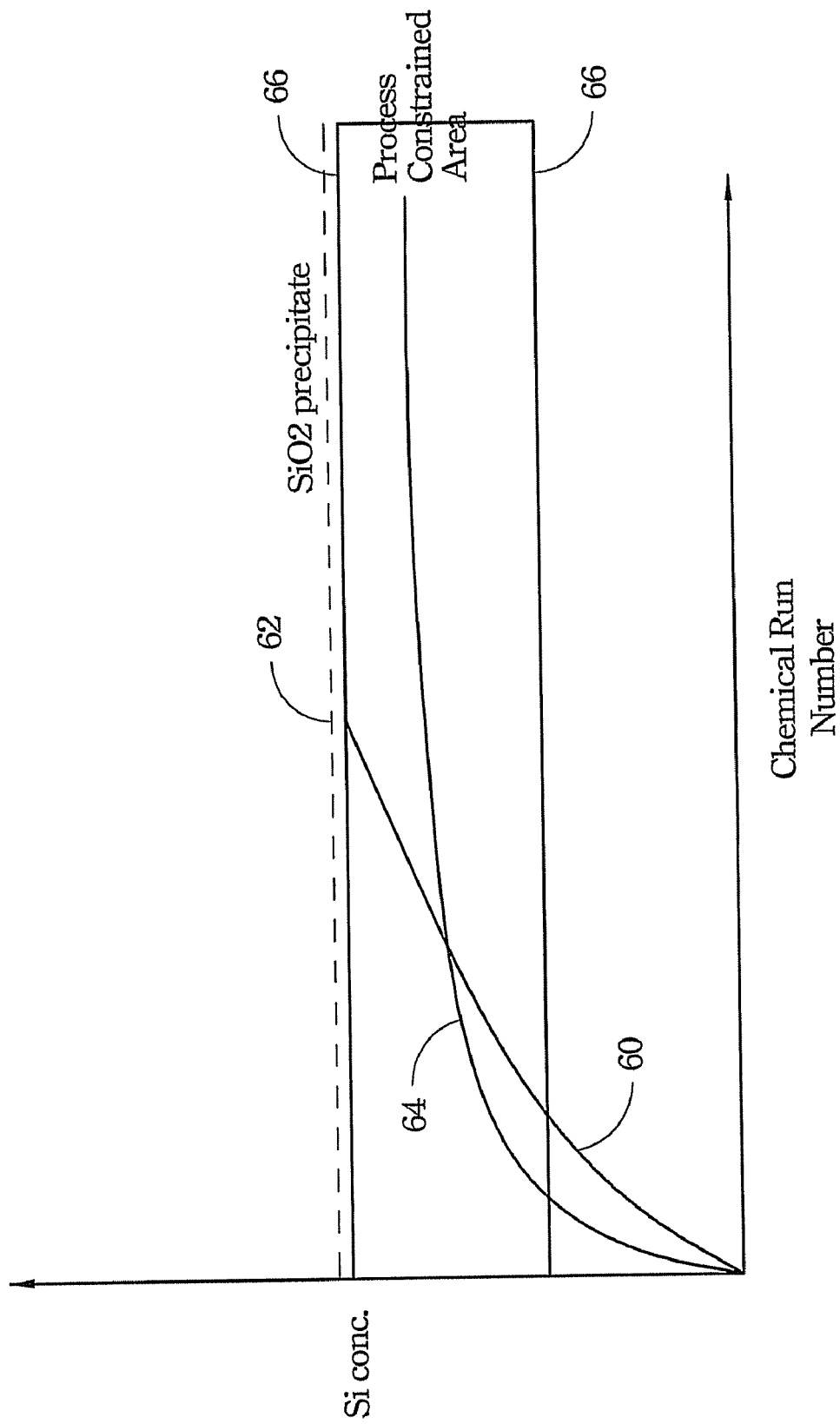
FIG. 2 is a graph illustrating control of silicon concentration in the etching bath.

Referring to FIG. 2, which is a graph of chemical run number versus silicon concentration, a chemical run may represent an event of etching a silicon nitride wafer or lot of silicon nitride wafers in etching bath 2. Each chemical run may generate one or several data points according to one embodiment in which the phosphoric acid is sampled and measured each time a wafer or batch of wafers is etched. As SiN is etched, silicon concentration in the bath generally increases. According to conventional tank designs as illustrated by curve 60, the silicon concentration increases to level 62 at which $SiO_2$ precipitation occurs. The hot $H_3PO_4$ bath according to the invention, represented by curve 64, does not approach $SiO_2$ precipitation levels because fresh $H_3PO_4$ is added responsive to the measured Si concentration when necessary to prevent the Si concentration levels from exceeding level 62. Curve 64 and the etching bath of the invention is maintained within process constrained area 66 and $SiO_2$ precipitation is circumvented, and particle contamination is prevented.

Figure 3:
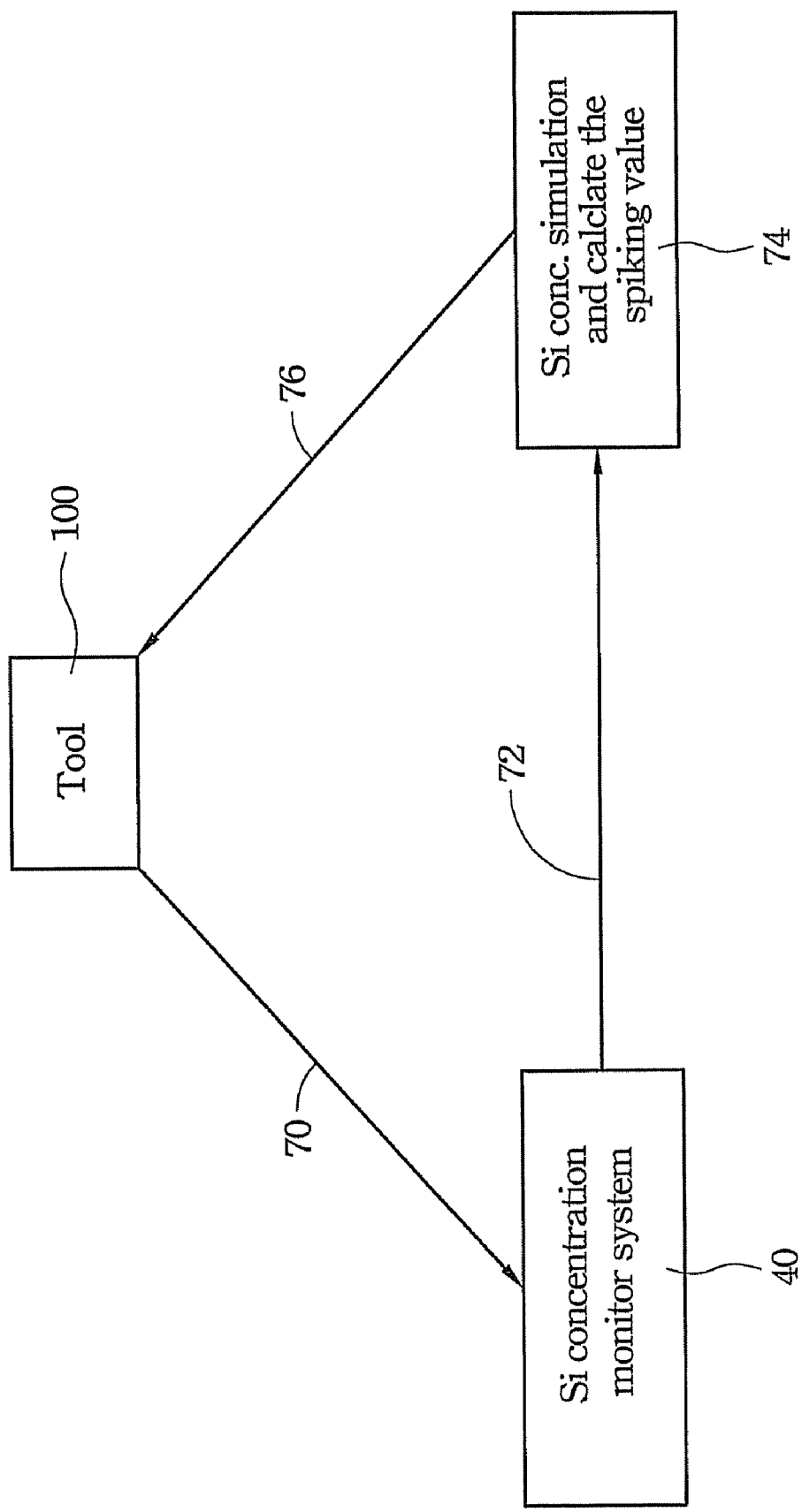
FIG. 3 is a diagram showing the control system of the invention.

FIG. 3 is a schematic diagram illustrating the automatic control system of the invention. Tool 100 provides information 70 by way of $H_3PO_4$, to Si concentration monitoring system 40 which measures Si concentration in the $H_3PO_4$. In one exemplary embodiment, measuring may be done after each run, i.e., after a silicon nitride etching operation has been carried out. Based on the measurement and information 72 provided to controller 74, it is determined whether fresh $H_3PO_4$ needs to be added and, if so, the quantity. In one exemplary embodiment, the amount of fresh $H_3PO_4$ to be added may be determined according to the following:

$$C_t = C_n(50-X)/50$$

$C_t$: Si concentration target
$C_n$: Si concentration at run=n
Dilution efficiency=50−X/50
Tank volume=50 liters, X=spiking volume In this manner, spiking volume X, if necessary, may be calculated in liters and information regarding the amount to be added provided to tool 100 as indicated by arrow 76. Other units may be used in other exemplary embodiments. In one exemplary embodiment, referring again to FIG. 1, the information represented by arrow 76 may be fed to controller 32. $C_t$, the Si concentration target, is associated with a silicon nitride:silicon oxide etch selectivity and will be determined by the desired or target etch rates and selectivity, which may vary. Both the Si concentration and silicon nitride and oxide etch rates and therefore the nitride:oxide etch selectivity may be controlled to maintain various tolerances. In one exemplary embodiment, the silicon nitride etch rate may be maintained so as not to fluctuate by more than 2% of a desired, i.e. target, etch rate, according to the method and system of the invention. In one exemplary embodiment, the silicon oxide etch rate may be maintained so as not to fluctuate by more than 2% of a desired, i.e. target, etch rate, according to the method and system of the invention. In one exemplary embodiment, the silicon nitride:silicon oxide etch selectivity may be maintained so as not to fluctuate by more than about 5%, preferably about 2%, of a desired etch selectivity according to the method and system of the invention.

Referring again to FIG. 1, the addition of heated, fresh $H_3PO_4$ at port 30 enables etching bath 2 to maintain an essentially steady state temperature which may be a temperature within the range of about 125° C. to about 175° C. (preferably within the range of about 130° C. to about 170° C.) and maintained at about +/−5° C., preferably +/−2° C. In one exemplary embodiment, the steady state temperature may not fluctuate more than 5° C., preferably 2° C., upon addition of heated fresh $H_3PO_4$. In another exemplary embodiment, the bath temperature may deviate from the steady state temperature for a time period less than one minute upon addition of heated fresh $H_3PO_4$. Other techniques for controlling the Si concentration and bath temperature may be used and depending on the level of control sought and the control limits of bath temperature and silicon concentration in place, will determine how frequently and for which concentration and temperature variation, fresh, heated $H_3PO_4$ must be added.

The preceding merely illustrates the principles of the invention. It will thus be appreciated that those skilled in the art will be able to devise various arrangements which, although not explicitly described or shown herein, embody the principles of the invention and are included within its spirit and scope. For example, the adjustable fresh hot chemical spiking may be determined by theoretical accumulated Si concentration calculation and not only using the actual Si concentration monitor.

Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for controlling an etching bath comprising:
providing a batch etching bath configured to process a batch of wafers therein, said batch etching bath containing phosphoric acid heated to an elevated bath temperature, said batch etching bath including an inner tank for processing said batch of wafers therein, and an outer tank;
measuring silicon concentration of silicon in said phosphoric acid contained in said batch etching bath while said silicon is in soluble form; and
responsive to said measuring, controlling said silicon concentration by adding fresh heated phosphoric acid to said phosphoric acid in said outer tank of said batch etching bath when necessary to maintain said silicon concentration within a desired range,
said fresh heated phosphoric acid heated by a dedicated phosphoric acid heater and wherein said measuring includes removing a sample of said phosphoric acid and diluting said sample with deionized water to produce a diluted sample and measuring said diluted sample before silica precipitation in said diluted sample, said deionized water having a temperature no greater than room temperature.

2. The method as in claim 1, wherein said controlling prevents silica precipitation.

3. The method as in claim 1, wherein said controlling further maintains a silicon nitride:silicon oxide etch selectivity of said batch etching bath so as not deviate by more than 2% from a target selectivity.

4. The method as in claim 1, wherein said elevated bath temperature is maintained within a range of about 130-170° C. and does not deviate by more than 2% during and after said adding fresh heated phosphoric acid to said outer tank of said batch etching bath.

5. The method as in claim 1, wherein said fresh heated phosphoric acid includes a temperature within a range of about 70° C.-160° C.

6. The method as in claim 1, wherein each of said measuring and said controlling, are carried out periodically.

7. The method as in claim 1, wherein said measuring silicon concentration comprises measuring said silicon concentration using atomic absorption spectroscopy.

8. The method as in claim 1, further comprising etching silicon nitride in said batch etching bath thereby producing said silicon in said batch etching bath via chemical reaction.

9. The method as in claim 1, wherein said controlling further maintains a silicon oxide etch rate of said batch etching bath within a desired range.

10. The method as in claim 1, wherein said measuring silicon concentration includes circulating said phosphoric acid from and to said batch etching bath, heating said circulating phosphoric acid and measuring said circulating phosphoric acid.

11. The method as in claim 1, wherein said controlling said silicon concentration by adding fresh heated phosphoric acid maintains a steady state temperature condition in said batch etching bath.

12. The method as in claim 1, wherein said controlling said silicon concentration to maintain a silicon nitride:silicon oxide etch selectivity of said batch etching bath within a desired range by adding fresh heated phosphoric acid, maintains a steady state temperature condition in said batch etching bath.

13. The method as in claim 1, wherein said elevated bath temperature reaches a steady state temperature that is between about 140° C.-160° C. and remains within a range of +/−2° C. and said elevated bath temperature does not deviate from said steady state temperature for more than 1 minute during and after said adding fresh heated phosphoric acid to said outer tank of said batch etching bath.

14. The method as in claim 13, further comprising maintaining said silicon concentration at about 60 ppm or less.

15. A method for controlling an etching bath comprising:
providing a batch etching bath configured to process a batch of wafers therein, said batch etching bath containing phosphoric acid heated to an elevated bath temperature, said batch etching bath including an inner tank for processing said batch of wafers therein, and an outer tank;
measuring silicon concentration of silicon in said phosphoric acid contained in said batch etching bath while said silicon is in soluble form; and
responsive to said measuring, controlling said silicon concentration by adding fresh heated phosphoric acid to said phosphoric acid in said outer tank of said batch etching bath when necessary to maintain said silicon concentration within a desired range,
said fresh heated phosphoric acid heated by a dedicated phosphoric acid heater,
wherein said measuring silicon concentration includes circulating said phosphoric acid from and to said batch etching bath, heating said circulating phosphoric acid and measuring said circulating phosphoric acid by removing a sample of said circulating phosphoric acid and diluting said sample with deionized water to produce a diluted sample and measuring said diluted sample before silica precipitation in said diluted sample, said deionized water having a temperature no greater than room temperature.

16. A method for controlling a silicon nitride etching bath comprising:
providing a batch etching bath including an inner tank configured to process a batch of wafers therein and an outer tank, said batch etching bath containing phosphoric acid heated to an elevated bath temperature greater than about 120° C.;
measuring silicon concentration of silicon in said phosphoric acid contained in said batch etching bath while said silicon is in soluble form; and
responsive to said measuring, controlling said silicon concentration to maintain a silicon nitride:silicon oxide etch selectivity of said batch etching bath within a desired range by adding fresh heated phosphoric acid to said phosphoric acid in said outer tank of said batch etching bath when necessary to maintain said silicon nitride etch rate within said desired range, while maintaining said elevated bath temperature so that said elevated bath temperature does not deviate by greater than 5% from a steady state value of said elevated bath temperature,
said fresh heated phosphoric acid heated by a dedicated phosphoric acid heater and delivered to said batch etching bath unmixed with other solutions,
wherein said measuring includes removing a sample of said phosphoric acid and diluting said sample with deionized water to produce a diluted sample and measuring said diluted sample before silica precipitation in said diluted sample, said deionized water having a temperature no greater than room temperature.

* * * * *